United States Patent [19]
Burns

[11] Patent Number: 5,377,077
[45] Date of Patent: Dec. 27, 1994

[54] ULTRA HIGH DENSITY INTEGRATED CIRCUIT PACKAGES METHOD AND APPARATUS

[75] Inventor: Carmen D. Burns, Austin, Tex.

[73] Assignee: Staktek Corporation, Austin, Tex.

[21] Appl. No.: 168,354

[22] Filed: Dec. 17, 1993

Related U.S. Application Data

[63] Continuation-in-part of Ser. No. 884,066, May 15, 1992, abandoned, which is a continuation-in-part of Ser. No. 561,417, Aug. 1, 1990.

[51] Int. Cl.$^5$ .............................................. H05K 7/20
[52] U.S. Cl. ...................... 361/704; 29/827; 165/80.3; 165/185; 174/16.3; 257/686; 257/712; 257/718; 361/705; 361/710; 361/708
[58] Field of Search ............... 29/827; 165/80.3, 185; 174/16.3, 252, 254; 257/686, 712, 718–719, 725–727; 361/690, 704–713, 717–722, 735, 744, 749, 789, 790

[56] References Cited

U.S. PATENT DOCUMENTS

| | | | |
|---|---|---|---|
| 2,241,493 | 12/1960 | Andrulits et al. | 437/209 X |
| 3,436,604 | 4/1966 | Hyltin et al. | 317/101 |
| 3,614,546 | 10/1971 | Avins | 317/234 R |
| 3,713,893 | 1/1973 | Shirland | 437/205 X |
| 3,739,462 | 6/1973 | Hasty | 29/577 |
| 3,746,934 | 7/1973 | Stein | 317/101 |
| 4,103,318 | 7/1978 | Schwede | 361/388 |
| 4,158,745 | 6/1979 | Keller | 174/52 FP |
| 4,222,516 | 9/1980 | Badet et al. | 235/492 |
| 4,288,841 | 9/1981 | Gogal | 361/414 |
| 4,321,418 | 3/1982 | Dran et al. | 264/102 X |
| 4,437,235 | 3/1984 | McIver | 29/840 |
| 4,451,973 | 6/1984 | Tateno et al. | 29/588 |
| 4,498,530 | 2/1985 | Lipschutz | 361/717 |
| 4,501,960 | 2/1985 | Jouvet et al. | 235/492 |
| 4,521,828 | 6/1985 | Fanning | 361/386 |
| 4,525,921 | 7/1985 | Carson et al. | 29/577 |
| 4,530,152 | 7/1985 | Roche et al. | 29/588 |
| 4,630,172 | 12/1986 | Stenerson et al. | 361/386 |
| 4,633,573 | 1/1987 | Scherer | 29/589 |
| 4,680,617 | 7/1987 | Ross | 357/72 |
| 4,684,975 | 8/1987 | Takiar et al. | 357/70 |

(List continued on next page.)

FOREIGN PATENT DOCUMENTS

| | | | |
|---|---|---|---|
| 340100 | 11/1989 | European Pat. Off. | 235/492 |
| 57-31166 | 2/1982 | Japan . | |
| 58-96756A | 6/1983 | Japan . | |
| 58-112348 | 7/1983 | Japan . | |
| 61-163652A | 1/1985 | Japan . | |
| 60-180150A | 9/1985 | Japan . | |
| 61-21943 | 9/1986 | Japan | 437/211 |
| 63-187652 | 3/1988 | Japan | 257/787 |
| 63-153849 | 6/1988 | Japan . | |
| 63-53959 | 8/1988 | Japan . | |

OTHER PUBLICATIONS

Information allegedly written by Emory Garth regarding "Memory Stacks", Application received a facsimile from Emory Garth on Jan. 26, 1993, Applicant does not know when this information was written or its validity. Catalog of Dense-Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870.

*Primary Examiner*—Gregory D. Thompson
*Attorney, Agent, or Firm*—Fulbright & Jaworski

[57] ABSTRACT

Thin and durable level-one and level-two integrated circuit packages are provided. A plurality of level-one integrated circuit packages may be aligned and securely bound in a stacked configuration by use of a flexible high temperature material, such as silicon adhesive tape or a conformal coating, to form a thin and durable horizontal level-two package, or stack. Various thermal conductors may be thermally coupled to the level-two package to help dissipate heat.

22 Claims, 9 Drawing Sheets

U.S. PATENT DOCUMENTS

| | | | |
|---|---|---|---|
| 4,722,060 | 1/1988 | Quinn et al. | 364/490 |
| 4,733,461 | 3/1988 | Nakano | 29/830 |
| 4,763,188 | 8/1988 | Johnson | 357/74 |
| 4,796,078 | 1/1989 | Phelps, Jr. et al. | 357/68 |
| 4,821,148 | 4/1989 | Kobayashi et al. | 361/392 |
| 4,823,234 | 4/1989 | Konishi et al. | 361/386 |
| 4,829,403 | 5/1989 | Harding | 361/386 |
| 4,833,568 | 5/1989 | Berhold | 361/383 |
| 4,839,717 | 6/1989 | Phy et al. | 357/74 |
| 4,855,868 | 8/1989 | Harding | 361/386 |
| 4,862,245 | 8/1989 | Pashby et al. | 357/70 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,888,307 | 12/1989 | Spairisano et al. | 437/216 |
| 4,891,789 | 1/1990 | Quattrini et al. | 365/63 |
| 4,948,645 | 8/1990 | Holzinger et al. | 156/252 |
| 4,953,005 | 8/1990 | Carlson et al. | 357/80 |
| 4,953,060 | 8/1990 | Lauffer et al. | 361/388 |
| 4,956,694 | 9/1990 | Eide | 387/74 |
| 4,994,411 | 2/1991 | Naito et al. | 437/217 |
| 4,997,517 | 3/1991 | Parthasarathi | 156/630 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 357/80 |
| 5,065,277 | 11/1991 | Davidson | 361/383 |
| 5,086,018 | 2/1992 | Conru et al. | 437/237 |
| 5,089,876 | 2/1992 | Ishioka | 357/70 |
| 5,099,393 | 3/1992 | Bentlage et al. | 361/413 |
| 5,108,553 | 4/1992 | Foster et al. | 29/852 |
| 5,138,430 | 8/1992 | Gow, 3rd et al. | 357/70 |
| 5,138,434 | 8/1992 | Wood et al. | 357/74 |
| 5,139,430 | 8/1992 | Mori | 437/183 |
| 5,147,822 | 9/1992 | Yamazaki et al. | 437/215 |
| 5,151,559 | 9/1992 | Conru et al. | 174/52.4 |
| 5,155,063 | 10/1992 | Tada | 437/211 |
| 5,200,362 | 4/1993 | Lin et al. | 437/267 |
| 5,214,845 | 6/1993 | King et al. | 29/841 |
| 5,223,739 | 6/1993 | Katsumata et al. | 257/676 |
| 5,264,990 | 11/1993 | Venambra | 361/761 |
| 5,315,480 | 5/1994 | Samarov et al. | 361/705 |

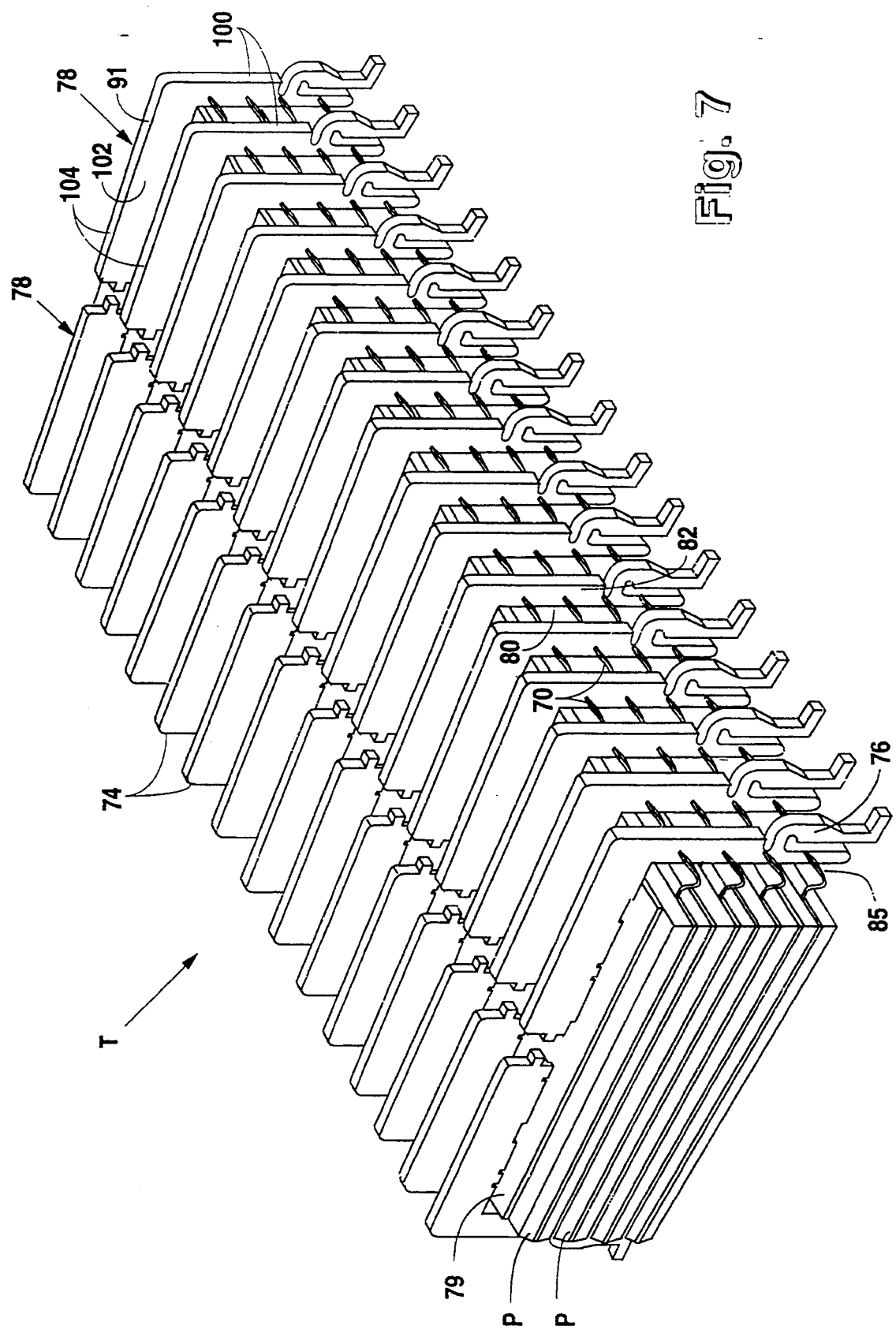

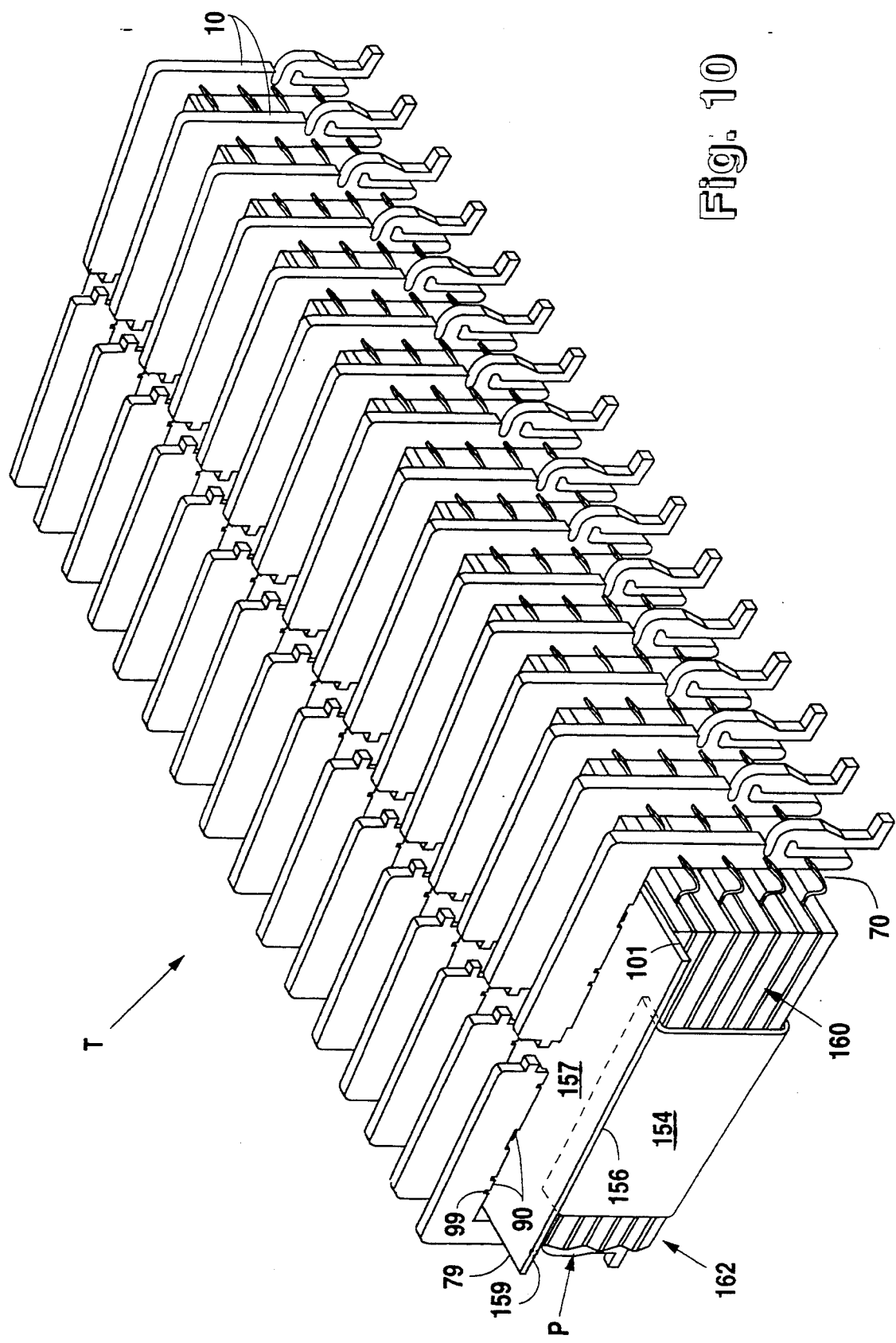

ULTRA HIGH DENSITY INTEGRATED CIRCUIT PACKAGES METHOD AND APPARATUS

This application is a continuation-in-part of application Ser. No. 07/884,066 filed May 15, 1992 now abandoned, is a continuation-in-part of application Ser. No. 07/561,417 filed Aug. 1, 1990.

BACKGROUND OF THE INVENTION

1. Field of the Invention.

This invention relates to a method and apparatus for achieving ultra high density integrated circuit packages incorporating a plurality of ultra-thin encapsulated integrated circuit packages stacked and interconnected into an ultra-high density three-dimensional module.

More specifically, this invention relates to apparatus and methods of fabricating ultra high density integrated circuit packages using high temperature flexible material to bind individual integrated circuit packages together in a stack configuration forming composite ultra high density integrated circuit packages.

2. Discussion of the Related Art

Packaging techniques for integrated circuits (ICs) have been developed in the past in an attempt to satisfy demands for miniaturization in the semiconductor industry. Improved methods for miniaturization of integrated circuits enabling the integration of millions of circuit elements into single integrated silicon embodied circuits, or chips, have resulted in increased emphasis on methods to package these circuits in space efficient, yet reliable and mass producible packages. Various methods and apparatus for fabricating ultra high density integrated circuits have been developed. Reference is hereby made to related and co-pending applications Ser. No. 07/884,066, filed May 15, 1992 and Ser. No. 07/561,417, filed Aug. 1, 1990, which are incorporated into the present application by reference.

Application Ser. No. 07/884,066 describes the construction of a modular level-two package comprised of a plurality of stacked level-one packages, which are laminated together using adhesive between each level-one package and a foil adhesive layer adhered to the top of the upper most level-one package and the bottom of the lower most level-one package in the level-two stack, or package. That application also discloses a method of forming a level-two stack of level-one packages whereby the level-two stack is connected to a rail assembly, which contains a shoulder and an extension with tabs. Tabs on the rail extension are secured to a cap at the top of the level-two stack to hold the stack in alignment. The rail shoulder prevents the rail extension tabs from causing an electrical short in the package. The rail provides electrical connections to the package and also provides improved heat dissipation from the package since the rail is connected to leads from the individual level-one packages in the level-two stack which extend outwardly from the individual level-one packages and are soldered onto the rail.

Application Ser. No. 07/561,417 describes a packaging technique whereby a level-two package is fabricated from level-one integrated circuits which are bound together using an epoxy adhesive applied between each level-one package and contain a metal foil which is applied to the top most and bottom most level-one package in the level-two package. That application also describes a method of mechanically binding the level-one packages together by using means such as a tie or a housing.

The introduction of highly sophisticated integrated circuit microprocessors led to the rapid development of complex personal computers and other common bus systems utilizing a variety of integrated circuit elements such as memory devices (DRAMS, VRAMS, FLASH ROMs, E PROMS, and SRAMS), programmable logic arrays (PLAs), microprocessors (CPUs), co-processors, and other related integrated circuit elements which had to be assembled, mounted and interconnected into as compact, yet reliable packages as feasible to satisfy the industry demands for miniaturization.

Other key considerations in developing packaging for such circuits have been the cost of manufacture, the reliability of the packaged device, heat transfer, moisture penetration, standardization of mounting and interconnect methods, and the ability to test and control the quality of the packaged devices.

In the past, one area of concentration for high density packaging has been memory devices such as SRAMS and DRAMS. Prior systems typically utilized a transfer molded plastic encasement surrounding the integrated circuit and having one of a variety of pin-out or mounting and interconnect schemes. The older M-DIP (Dual-In-line-Plastic) provides a relatively flat, molded package having dual parallel rows of leads extending from the bottom for through-hole connection and mounting to an underlying circuit board substrate. These packages provided 100 mil spacing between leads.

A more dense package was the 100 mil SIP (Single-In-Line-Plastic) which was assembled on edge with two rows of 100-mil staggered leads extending from the bottom edge for through-hole assembly.. Another popular prior art package is the PLCC (Plastic Leaded Chip Carrier) SOJ (Small Outline J-leaded) molded package with twenty surface-mount designed J-leads (length 0.67", width 0.34", height 0.14"). This prior art package is illustrated schematically in FIG. 1 and shown at approximate actual size in FIG. 2.

In order to obtain more density and provide lower cost socketability (i.e. removable mounting) and to allow for after-market sale of additional memory units, the SIMM (Single-In-Line Memory Module) was developed. This package is schematically illustrated in FIG. 3. In this package typically nine one-megabyte or four-megabyte DRAMS were surface mounted into a socket which was in turn edge-mounted on a large circuit board substrate containing additional sockets or components. While this design provided some increase in density, it had the drawback of providing a module extending from one-half to nearly two inches vertically above the circuit board substrate.

Newer, higher density versions of the SIMM design with even smaller versions of the DRAM plastic package have been developed. These thinner versions of SOJ DRAMS are one-half the thickness (having a plastic packaging thickness of about 70 mils) of standard SOJ designs, and have been mounted on both sides of circuit board substrates. Even smaller TSOP packages have been developed experimentally with a plastic thickness of one millimeter and lower profile gull-wing leads for surface mounting. FIGS. 1-3 illustrate typical embodiments of some of these prior art packages. Based on experience with those prior art designs, for reasons of reliability related to moisture penetration and mechanical integrity, the industry has adopted a standard thickness for plastic packaging of approximately one millimeter (40 mils), or approximately 10.5 mils on each side of a 11 mil thick integrated circuit element attached to a 8 mil thick lead frame.

In contrast to such prior art systems, the packaging method of the present invention provides a reliable, cost efficient, easily manufacturable package with a plurality of ultra thin level-one package elements assembled in an integrated module or level-two package which can be mounted to a circuit board substrate directly or via an underlying socket or header.

Key considerations in developing packaging for such high density circuits have been the cost and simplicity of manufacture, reliability, heat transfer properties, moisture penetration, standardization of mounting and interconnect methods, and the ability to test and control the quality of the packaged devices.

SUMMARY OF THE INVENTION

The present invention provides a quick and cost-effective way to securely bind together a stack of individual integrated circuits to provide a level-two ultra high density integrated circuit package. The present invention is an improvement over other methods since it reduces the cost and number of manufacturing steps in constructing the level-two package. For example, the present invention does not require the time-consuming step of curing epoxy, as is typically required in prior methods.

The present invention also allows the level-two package to be easily reworked during manufacturing, testing and operation since a defective level-one integrated circuit in the stack can easily be removed and replaced by unfastening the high temperature flexible material used to bind the stack and then replacing the defective IC. In prior art methods, the entire level-two package would have been discarded if only one level-one IC contained therein was defective, because epoxy was used between each level-one IC.

With the present invention, the individual integrated circuits are bound together in a level-two package configuration with a thin, fast-drying, high-temperature, flexible material surrounding a portion of the outside of the level-two package, or stack. Using this method, level-one integrated circuit packages are stacked one on top of another. A cap is secured to the upper extensions of a rail assembly which provides structural support to the stack as well as electrical and thermal conduction via the leads extending from each level-one package. The number of rails making up the assembly corresponds generally to the number of external leads in the level-one packages. Individual leads of each level-one integrated circuit package are generally soldered to a corresponding external rail. A thin, high-temperature flexible material is applied to secure the stack by either: (1) attaching thin flexible material impregnated with silicon adhesive to the bottom of the lower most level-one integrated circuit package and running it up the outside of the stack where the other end of the material is secured to the to of, or bottom surface of a cap; or (2) applying a conformal coating to the non-leaded sides and/or ends of the level-two stack of level-one IC packages and extending over the end of the cap so as to support the stack of level-one packages from the cap.

The high temperature flexible material must be flexible at room temperature, but must be able to withstand exposure to high temperatures associated with solder reflow procedures (approximately 215° C.) without losing flexibility or deteriorating. The method of this invention is very effective, time saving, economic and extremely effective.

BRIEF DESCRIPTION OF THE DRAWINGS

FIG. 7 is an isometric view of one embodiment of a horizontal level-two package according to the present invention;

FIG. 10 is an alternative embodiment of a level-two package, secured together by use of a thin flexible high temperature material, such as silicon adhesive tape.

DETAILED DESCRIPTION OF THE PREFERRED EMBODIMENT

A better understanding of the present invention can be had when the following detailed description is read with reference to the drawings wherein common elements are designated with like numbers or letters. The invention disclosed in related applications, Ser. Nos. 07/561,417 and 07/884,066, which are incorporated herein by reference, provide an integrated circuit packaging method which enables level-one elements to be packaged in transfer molded casing approximately 7 mils or less thick, encompassing an integrated circuit die element approximately eight to sixteen mils thick to produce a reliable level-one package less than thirty-two mils thick. As disclosed in the parent application, these level-one units may then be bound together mechanically or using an epoxy adhesive approximately one mil thick, with the outer surfaces of the outside level-one units having a vapor barrier such as a thin metal layer adhered thereto or deposited using known semiconductor manufacturing methods such as vacuum deposition, sputtering or the like and adhesive lamination. Throughout this application where it is necessary to adhere a thin film to a substrate or surface of a level-one package, the preferred adhesive materials are high-temperature, moisture resistant materials such as polyimide 111-15 from Creative Materials, Inc., thin freebase film xl-5000 available from Ablestik Laboratories, or XK/5022-81C from Epoxy Technology, Incorporated.

Figure 1:
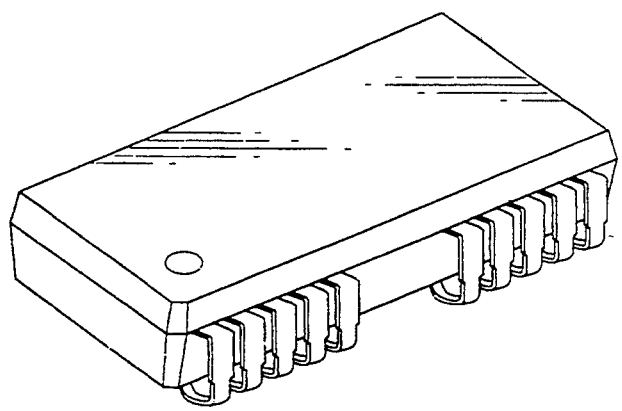
FIGS. 1–3 illustrate prior art packaging for integrated circuits.
Figure 2:
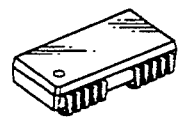
Figure 3:
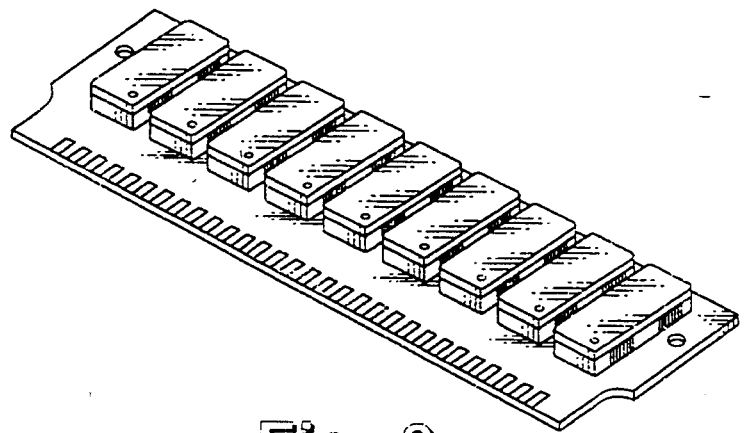
Figure 4:
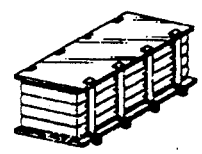
FIG. 4 is a pictorial illustration of a three dimensional package for integrated circuits as more fully described in co-pending commonly assigned U.S. patent application Ser. Nos. 07/884,066 and 07/561,417.
Figure 5A:
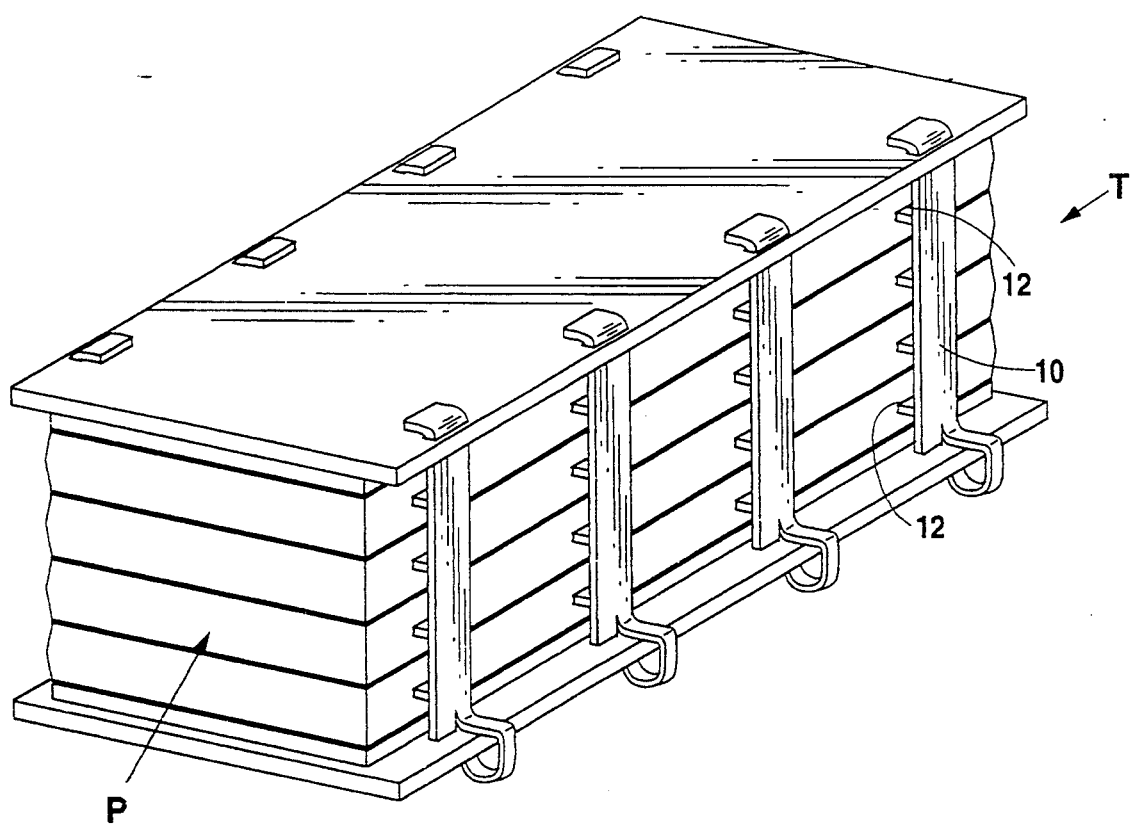
FIGS. 5a–5c are pictorial illustrations of level-two packaging more fully described in co-pending commonly assigned U.S. patent applications Ser. Nos. 07/884,066 and 07/561,417.
Figure 5B:
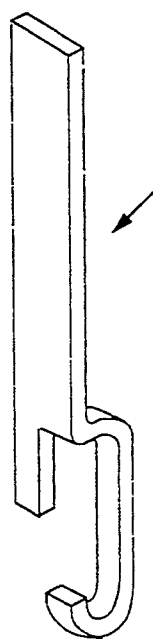
Figure 5C:
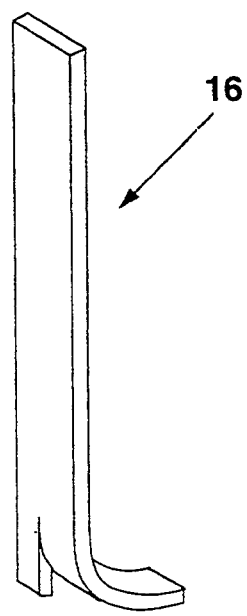

Application Ser. No. 07/561,417 provides a horizontally stacked module embodiment which utilizes level-one packages P laminated together in a horizontal module or level-two package T. In this embodiment, illustrated in FIG. 5a, electrical interconnection and thermal conduction are provided by an array of vertically oriented conductive rails 10 aligned with the vertical columns of leads 12, and extending from the top to the bottom of the stack. These rails can be configured with SMT J-leads 14 (FIG. 5b) or gull-wing leads 16 (FIG. 5c) for the package. Significant advantages are realized by incorporating an electrical signal bus and integral heat-sink in the vertical rails 10 which also provide structural integrity for the horizontal module.

A unique feature of the horizontally oriented level-two module or package T is the relatively large cross-sectional area of the rails 10 connecting the leads 12 of the level-one packages P. These rails 10 act as excellent low impedance buses for both electrical current flow and thermal heat transfer. The low electrical impedance provides for less ground bounce, less signal distortion, and improved signal integrity. The low thermal resistance allows for improved heat transfer from the die interior, which provides increased reliability and longer operating life for some embodiments, and in ultra-high density embodiments provides a package that can be adequately heat compensated with conventional convection techniques.

Level-One Packages

As disclosed in the parent application, Ser. No. 07/561,417, a thin transfer molded casing is used to package an integrated circuit die element. Since one of the goals of this invention is to achieve thin yet durable and reliable integrated circuit packaging, it is important that the molded casing be made as thin as possible without breaking, warping or destroying the integrity of the integrated circuit package. It has been discovered that one effective way to achieve a thin and durable integrated circuit die element package is to ensure that the integrated circuit die element maintains a position parallel and above the horizontal lower surface of the mold during the molding process. Positioning the integrated circuit die element parallel to and above the lower surface of the mold ensures that when the molding compound is transferred into the mold, it will distribute somewhat evenly around the entire surface of the integrated circuit die element. If the integrated circuit die element is not held in position, one side of the die element will have a thicker coating of molded casing than is necessary while the other side may have too thin a layer of casing. The molded casing may have to be applied thicker than necessary to ensure that there are no thin areas. Regardless, the application of uneven molded casing may cause warping of the integrated circuit package if the silicon die is 14 mils or thinner.

Figure 6:
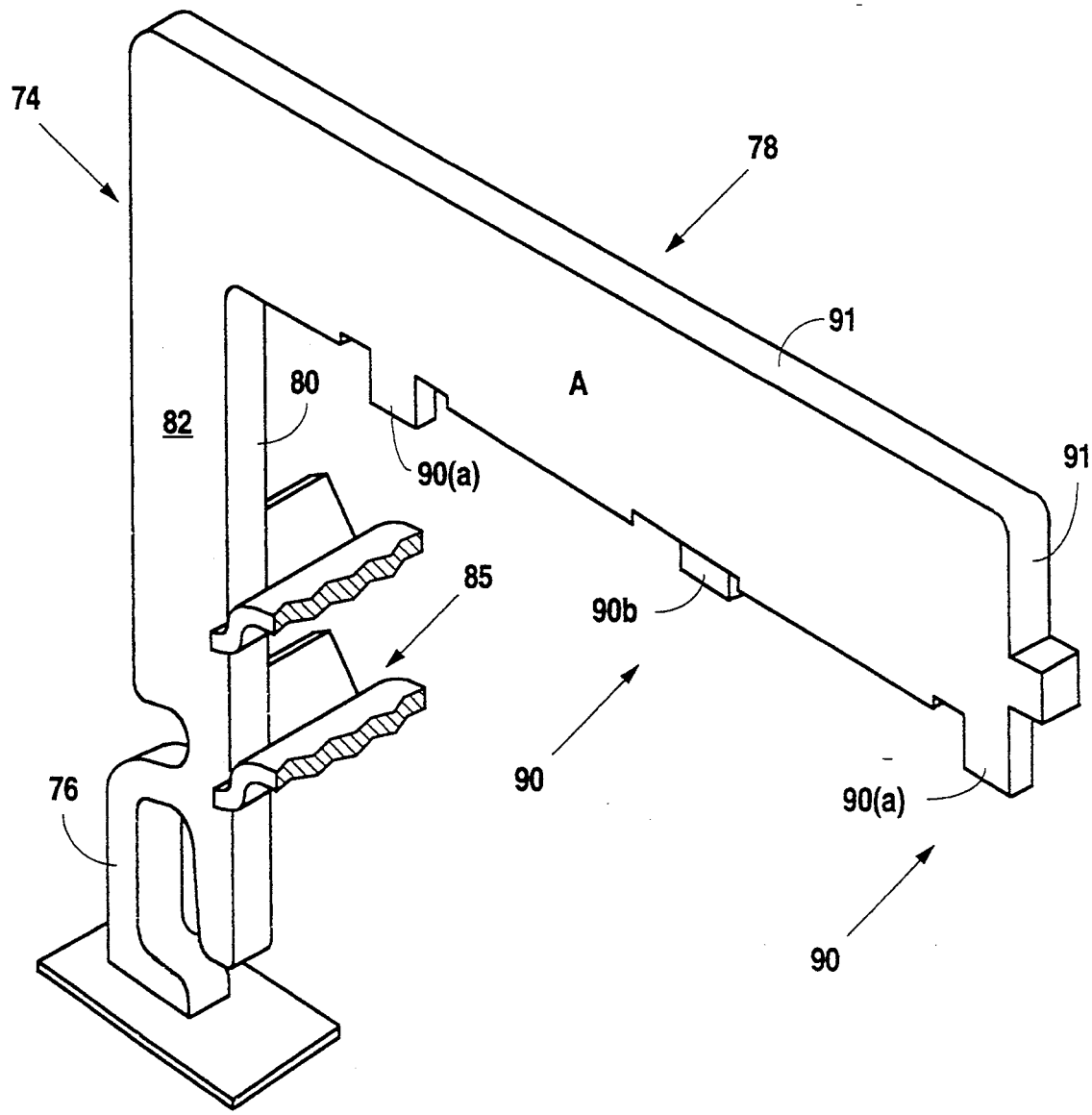
FIG. 6 is an enlarged isometric view of a rail having an extension and tabs and wherein leads are coupled to the rail in an alternative embodiment of a level-two package of the present invention.

Referring now to FIGS. 6 and 7, illustrate an embodiment of a three dimensional level-two package T, which includes rail 74 with an upper extension 78. More specifically, FIG. 6 illustrates an extension 78 which includes tabs 90 spread along the lower edge thereof. Note that tabs 90 are one-half the thickness of the edge 91 of rail extension 78. Note also that alternating tabs 90a and 90b, while being half the thickness of edge 91, have one side that is flush with either side A of extension 78 or side B (not visible in FIG. 6), which is the side opposite to side A. Tabs 90a and 90b may be formed as illustrated by any suitable metal fabrication technique such as etching.

Figure 8A:
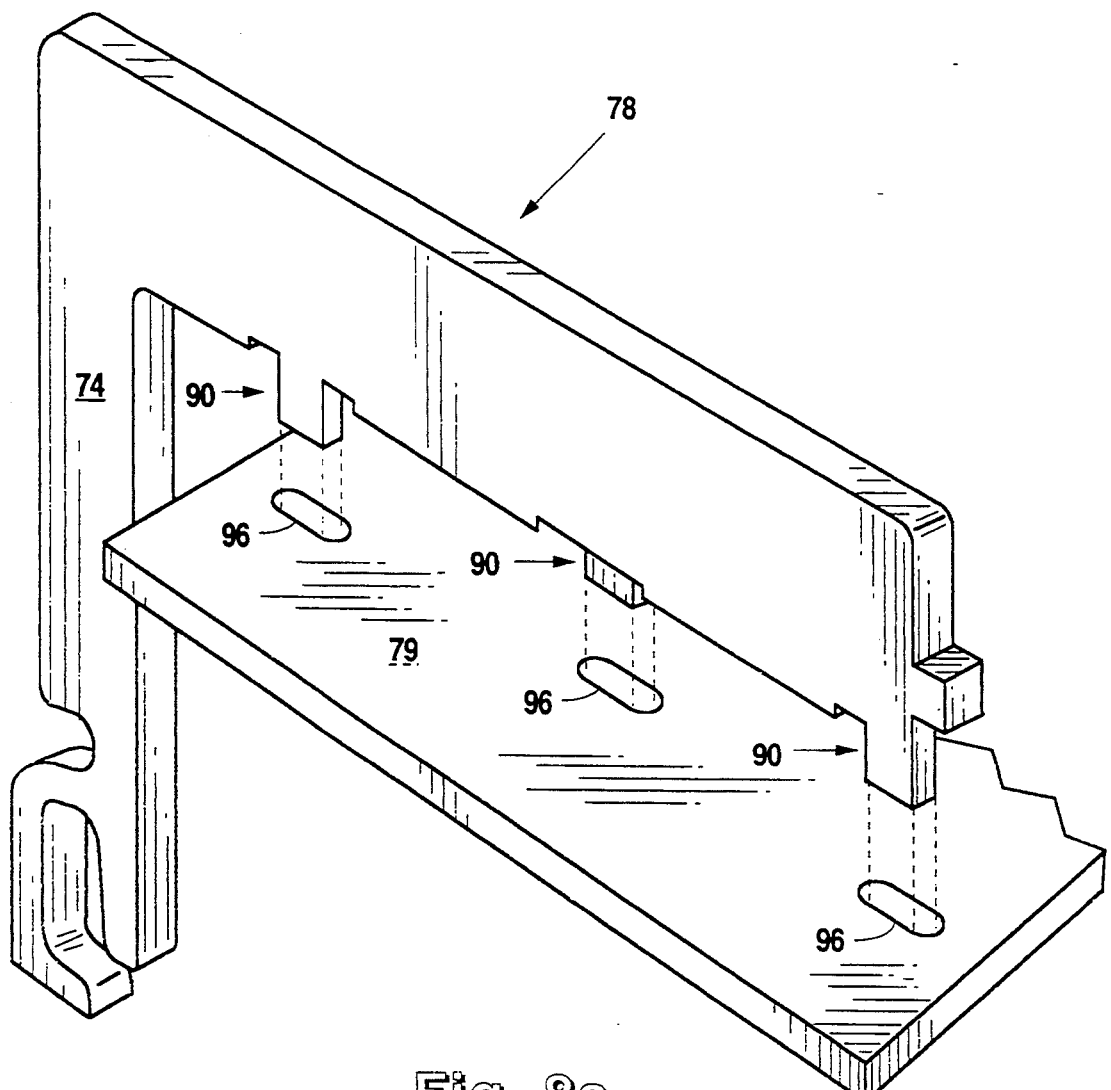
FIG. 8a is a perspective view of how the tabs of a rail are inserted into holes in a cap member in accordance with the present invention.
Figure 8B:
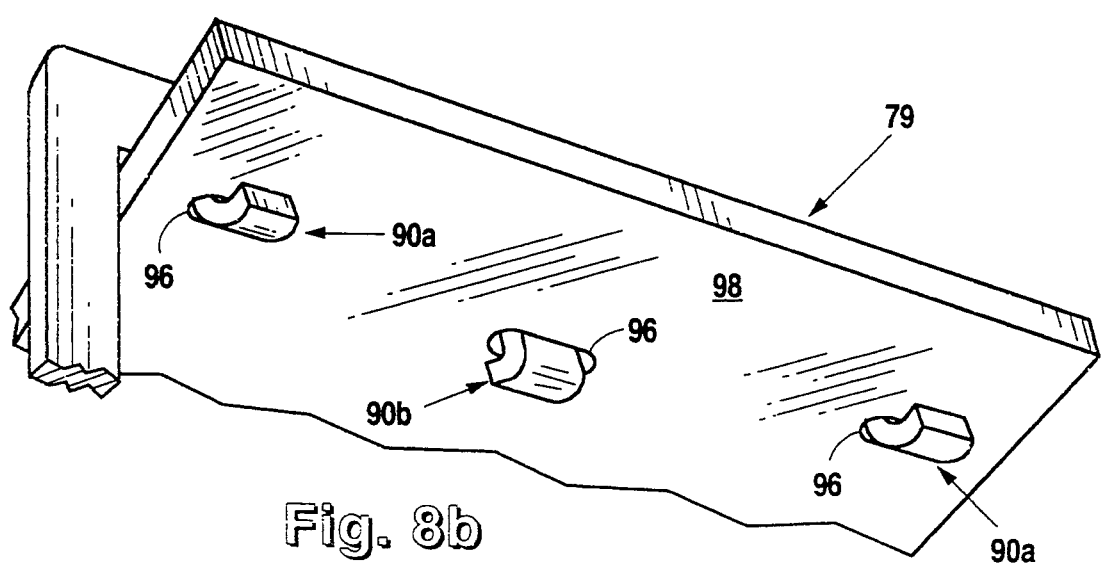
FIG. 8b is an enlarged isometric view of the tabs of a rail being bent against a top member so that the rail is secured to the cap member in accordance with the present invention.

FIGS. 7, 8a and 8b illustrate the function of tabs 90. FIG. 7 illustrates rails 74 having extensions 78 coupled by their tabs 90 to cap 79. Cap 79 may be made with seven mil thick FR-4 or polyimide circuit board substrate. Holes 96 are machined in cap 79 in locations to accommodate tabs 90 of rail 74. See FIG. 8a. Tabs 90 are inserted through holes 96 and then bent by a roller mechanism to flatten the tabs against surface 98 of cap 79. See FIG. 8b. Since tabs 90a and 90b are half the thickness of extension 78 they bend more easily. The positioning of tabs 90a and 90b with respect to sides A and B of extension 78 causes these tabs to be bent in opposite directions resulting in more secured coupling between the rail extension 78 (not visible) and the cap 79. See FIG. 8b. Note that in assembling the horizontal level-two package, the rails 74 are first coupled to cap 79 as illustrated in FIGS. 8a and 8b, and then the stack of level-one packages are coupled with the rail and cap assembly as follows: the uppermost level-one package is positioned flush with the cap 79, and then the rails 74 and leads 70 are mated in the stack together and are soldered together. A completely assembled horizontal level-two package is illustrated in FIG. 7.

Figure 8C:
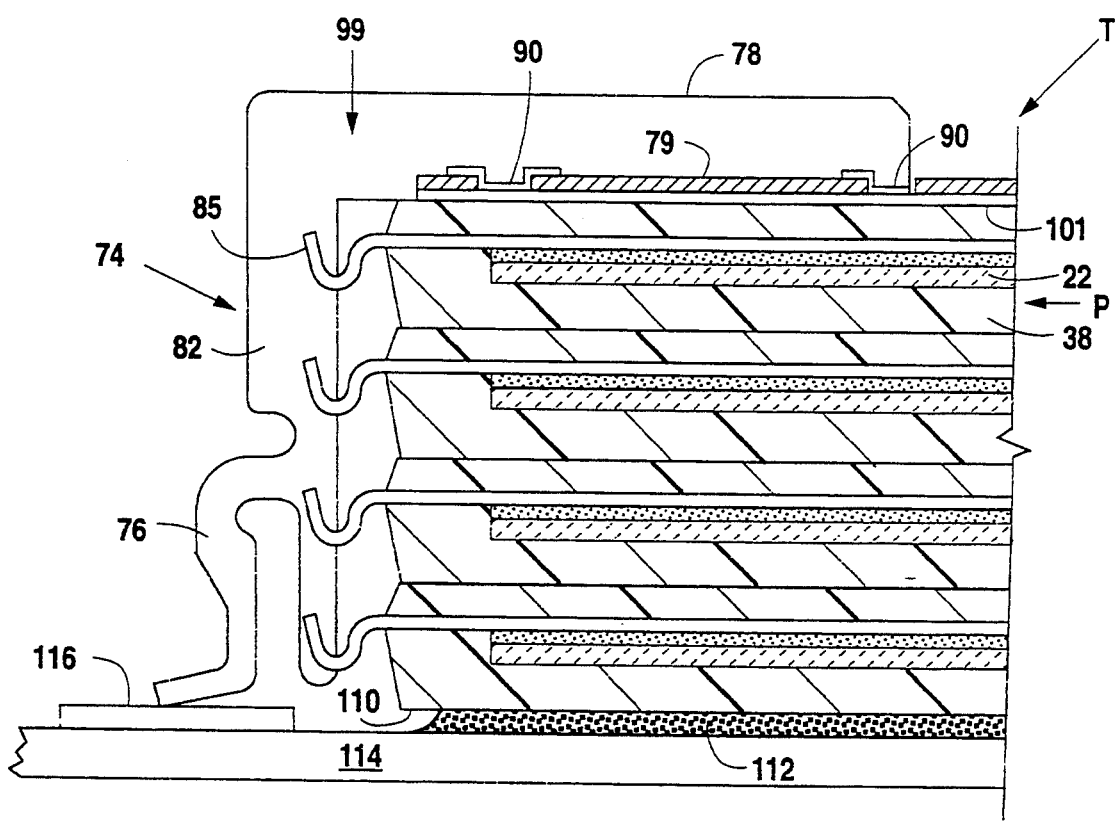
FIG. 8c is a cross-sectional view of a horizontal level-two package with an alternative embodiment of the rails in accordance with the present invention.

FIG. 8c illustrates a cross-sectional side view of a level-two package wherein the rail extension 78 is provided with a shoulder 99 which rests flush with the uppermost level-one package P. Shoulder 99 helps keep the rail extension 78 and the bent tabs 90 in their desired positions, and thereby prevents possible electrical shorting from the uppermost level-one package P to the bent tabs.

The horizontal level-two package illustrated in FIG. 7 provides heat dissipation advantages. Coupling the edge 80 of rails 74 to leads 70 causes the side 82 of the rails to extend outwardly from the stack of level-one packages P so as to form multiple heat dissipating fins 100. Furthermore, rail extensions 78 also act as heat dissipating fins. As discussed above, extensions 78 have tabs 90 which extend from the bottom of the edge 91 for coupling with cap 79. When extensions 78 are coupled to cap 79 in this arrangement, the side of extensions 78 that is wider than edge 91, indicated by reference numeral 102, extends upwardly away from the cap and acts as a fin. Multiple rail extension fins are designated by reference numeral 104. Fins 100 and 104 provide heat dissipation away from the horizontal level-two package T when air is circulated across the fins. Fins 100 and 104 thus act as heat sinks. It should be appreciated that the positioning of fins 100 and fins 104, such as their angle, can be adjusted to accommodate space limitations on the sides and tops of horizontal level-two package T and the direction of air circulation.

Figure 9A:
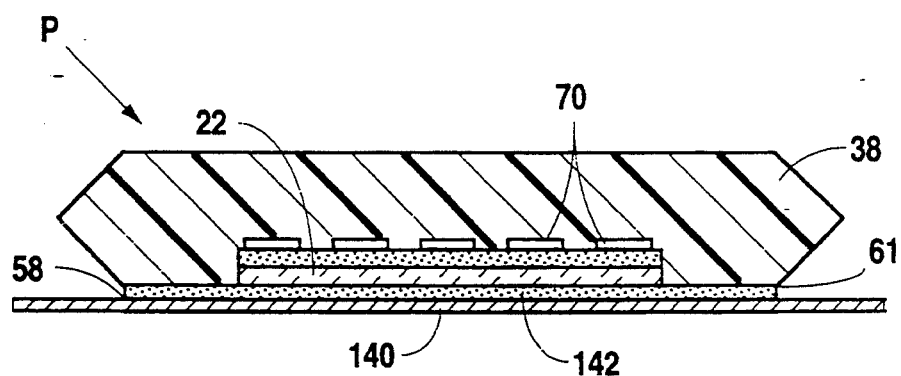
FIG. 9a is an alternative embodiment of packaging an integrated circuit die element.
Figure 9B:
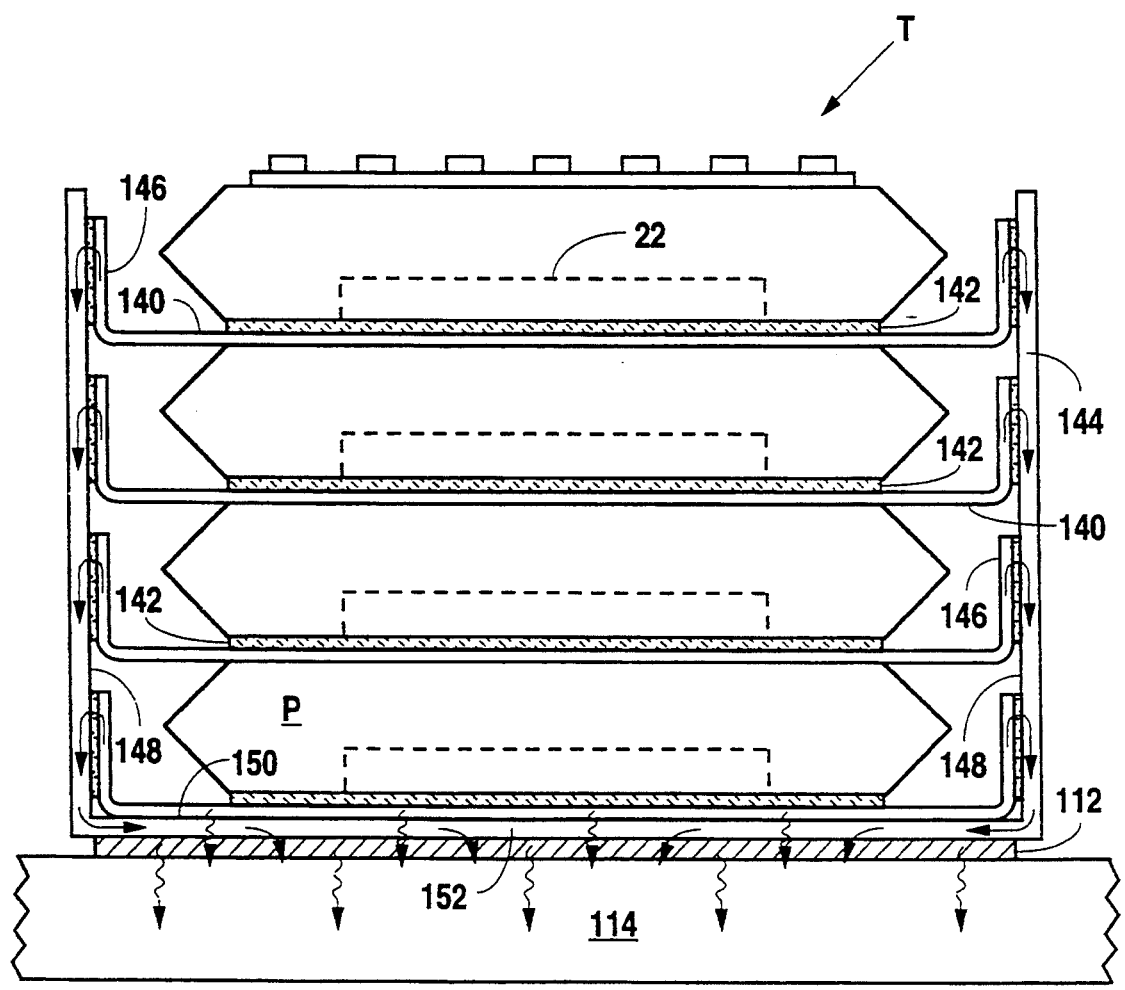
FIG. 9b is an alternative embodiment of a level-two package, which is attached to a circuit board substrate, in accordance with the present invention.

FIGS. 9a and 9b illustrate additional embodiments for high heat-dissipation. FIG. 9a illustrates a level-one package P comprising a die element 22 with casing 38 on the upper and side surfaces and a metal layer 140 affixed to the lower surface 58 of the die element and lower surface 61 of the casing with electrically and thermally conductive adhesive 142. As illustrated, metal layer 140 may extend from the sides of package P. The metal layer is preferably made of a good thermal and electrical conductor such as copper. Leads 70 may extend from the sides of package P but are not visible in the illustrated axis. Metal layer 140 acts as an effective heat sink for package P. Metal layer 140 may also be used as an electrical conductor by electrically coupling the metal layer to voltage ground or some other reference voltage ($V_{ss}$).

Multiple level-one packages P of the type illustrated in FIG. 9a may be put into a stacked horizontal level-two package T arrangement as illustrated in FIG. 9b. Level-two package T may include leads extending from the sides of packages P, but the leads are not visible in the illustrated axis. Any of the lead and rail coupling embodiments discussed herein or in the referenced co-pending applications may be used. The level-two package T of this embodiment includes an outer metal layer 144 that wraps around the sides and bottom of the axis of the package T which avoids interference with any leads and/or rails. The metal wraparound layer 144 is preferably made of copper or a similar thermally conductive material. Any ends 146 of metal layer 140 that extend from the sides of packages P may be bent to be substantially flush with the inner wall 148 of metal wrap-around layer 144. The ends 146 of metal layers 140 may be affixed to the inner wall 148 by a thermally conductive solder, epoxy or other suitable material. The bottom surface 150 of the metal layer 140 of the lowermost level-one package P rests on the lower surface 152 of the metal wrap-around layer 144.

In another embodiment, referring to FIG. 10, a level-two package T, or stack, can be made from a multiplicity of level-one packages P by applying a thin flexible high temperature material 154 to opposite ends of the stack T to hold the stack T together securely. Leads 70 from the level-one packages P are held in proper alignment in a row and column configuration. A level-two package T is shown where cap 79 extends beyond perimeter wall 160 of the level-two stack T comprised of multiple level-one packages P. A lip 101 of cap 79 is formed where cap 79 extends beyond perimeter wall 160. Cap 79 is shown to have a top surface 157 and a bottom surface 156.

Figure 11:
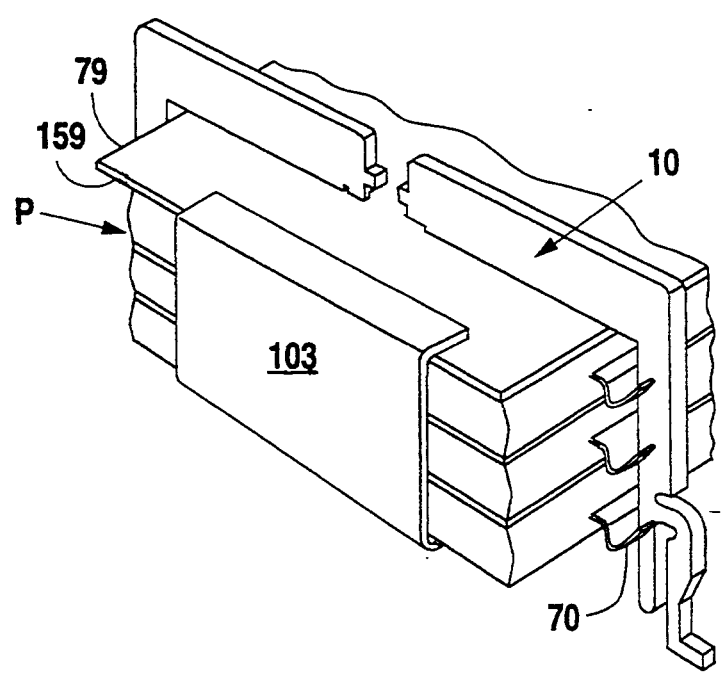
FIG. 11 is an alternative embodiment of a level-two package, secured together by use of a thin flexible high temperature material, such as a conformal coating.

A thin flexible high temperature material 154, such as Kapton tape with silicon adhesive sold by 3M Corporation, can be used, or any other tape or material suitable for holding the level-two stack T together so that it secures the stack T in proper alignment, but allows a defective level-one package P to be easily removed from the stack T if found to be defective after releasing the material and unsoldering the leads 70 of the respective level-one package P from rails 10. The tape, or other suitable material must be sticky at room temperature and remain sticky at solder reflow temperatures (approximately 215° C.). The material 154 must also be able to retain flexibility at these high temperatures without deteriorating, becoming brittle or losing adhesion to the level-two stack T. Material 154 can be secured to the level-two package T as shown in FIGS. 10 or 11 so that the level-two stack T of level-one packages P is held together in proper alignment. One end of the material 154 can be affixed to a portion of the bottom surface 156 of cap 79 on lip 101 and material 154 can then be pulled down and over stack T, coming into adhesive contact with an end of each level-one package P in stack T, and then wrapping around the bottom edge of stack T to terminated and affixed to a portion of the bottom surface 162 of level-two package T. The opposite end of level-two stack T is secured in the same manner by an additional material.

In another application, one end of material 154 can be affixed to a portion of the bottom surface 156 of cap 79 on lip 101 and then material 154 can be pulled down against the stack T, coming into adhesive contact with an end of each level-one package P in stack T, and then material 154 can be wrapped completely across the bottom surface 162 of the level-two package T and then brought up the opposite side of the package, not shown, where the other end of material 154 is then affixed to a portion of the bottom surface 156 of cap 79 on lip 101. Material 154 must be affixed so as to not interfere with the electrical and thermal coupling between the leads 70 of the level-one packages P and rails 10. Material 154 may also be applied to wrap around end 159 of cap 79 so as to adhere to upper surface 157 of cap 79.

In another embodiment, referring to FIG. 11, an isometric view of a level-two package T is shown comprised of a multiplicity of level-one integrated circuit packages P. In this embodiment, a thin flexible high-temperature material is a conformal coating 103, which is applied to opposite ends of the level-two package T, as shown, so as to not interfere with the electrical and thermal coupling between the leads 70 of the level-one packages P and rails 10. Conformal coating 103 must be capable of maintaining adhesion with the ends of each level-one package P in stack T at room temperature and at solder reflow temperatures (approximately 215° C.). Conformal coating material 103 must also be able to retain flexibility at room temperature and at these high temperatures without deteriorating, becoming brittle or losing adhesion to the level-two stack T. One such suitable conformal coating is sold under the brand designation of McGhan Nusil R-2186 silicon elastomer, which is a two-part, translucent, pourable silicon system which will cure at room temperature. It is generally desirable to also use a surface primer such as McGhan Nuril SP-135 high technology, silicon primer before applying the coating.

A suitable conformal coating 103 can be applied to the level-two stack T by dipping either end of level-two stack T, that does not have leads extending therefrom, into a heated bath of a conformal coating mixture (not shown), or otherwise applied, so that the conformal coating 103 adheres to each level-one package P, and cap 79, in level-two stack T, but is thinly applied and does not interfere with the electrical and thermal connections of the leads 70 of each level-one package P to rails 10.

As illustrated in FIG. 9b, for heat dissipation, package T may dissipate heat from each metal layer 140 to metal wrap-around layer or partial saddle 144 and into the circuit board substrate 114, as represented by the arrows. The level-two package T may include further heat-dissipation capability if it is provided with rail and lead arrangements such as discussed above in reference to FIG. 7. Efficient heat dissipation may be provided, as shown in FIG. 9b, through just the contact of the metal layer 140 of the lowermost level-one package P with the lower surface 152 of metal wrap around layer 144. Thus, contact by all of metal layers 140 with the metal wrap-around layer 144 may not be necessary. Of course, a greater area of contact by thermal conductors with package P will provide a greater surface area for heat dissipation The foregoing disclosure and description of the invention are illustrated and explanatory of the preferred embodiments, and changes in the size, shape, materials, components, circuit elements, connections, and construction may be made without departing from the spirit of the invention.

What is claimed is:

1. A modular integrated circuit package, comprising:
   a plurality of level-one integrated circuit packages, each comprising:
   (a) an integrated circuit element, said element comprising an integrated circuit formed on a semiconductor substrate and having a plurality of electrical interconnect leads extending therefrom;
   (b) a protective layer surrounding said integrated circuit element, wherein said protective layer has an upper surface, a lower surface and a perimeter wall; and wherein said leads extend from said substrate through a portion of said perimeter wall of said protective layer;
   wherein said level-one packages are aligned in a stacked configuration to form a level-two package so that said leads from said lever-one packages are aligned in a row and column configuration; and
   wherein said level-one packages are bound together by use of a high temperature flexible material.

2. The package of claim 1, wherein said high-temperature flexible material comprises a conformal coating capable of withstanding solder reflow temperatures without deteriorating significantly or losing substantial flexibility.

3. The package of claim 2, wherein said conformal coating is applied to at least a portion of said perimeter wall of said protective layer surrounding each said level-one integrated circuit element in said level-two package.

4. The package of claim 3, wherein said conformal coating comprises a flexible, high-temperature silicon-based compound.

5. A modular integrated circuit package comprising:
   a plurality of level-one integrated circuit packages, each comprising:
     an integrated circuit element, said integrated circuit element comprising an integrated circuit formed on a semiconductor substrate and having a plurality of electrical interconnect leads extending therefrom;
     a protective layer surrounding said integrated circuit element, said protective layer having an upper surface, a lower surface and a perimeter wall, and wherein said leads extend from said substrate through said perimeter wall of said protective layer;
   said level-one packages being aligned in a stacked configuration to form a level-two package, said level-two package having an upper surface, a lower surface, and a perimeter wall having a front, a back, and a first and second side; wherein said leads from said level-one packages are aligned in a row and column configuration on either or both said front and back side of said level-two package; and
   a high temperature flexible band which wraps around at least a portion of said upper surface, said first side, said lower surface, and said second side of said level-two package.

6. The package of claim 5, wherein said band comprises tape containing a silicon adhesive.

7. The package of claim 6, wherein said tape consists of tape containing a silicon adhesive.

8. The package of claim 5, wherein said band remains tacky at room temperature and at solder reflow temperatures.

9. A modular integrated circuit package comprising:
   a plurality of level-one integrated circuit packages, each comprising:
     an integrated circuit element, said integrated circuit element comprising an integrated circuit formed on a semiconductor substrate and having a plurality of electrical interconnect leads extending therefrom;
     a protective layer surrounding said integrated circuit element, said protective layer having an upper surface, a lower surface and a perimeter wall, and wherein said leads extend from said substrate through said perimeter wall of said protective layer;
   said level-one packages being aligned in a stacked configuration to form a level-two package; said level-two package having an upper surface, a lower surface, and a perimeter wall having a front, a back, and a first and second side; wherein said leads from said level-one packages are aligned in a row and column configuration on either or both said front and back side of said level-two package; wherein said upper surface of said level-two package comprises a cap member thereon having a top and a bottom surface; and
   a high temperature flexible band which contacts at least a portion of said tops of bottom surface said cap member, and said first side, lower surface, and second side of said level-two package.

10. The package of claim 9, wherein said cap member extends beyond said perimeter wall of said level-two package above said first side of said perimeter wall and said second side of said perimeter wall of said level-two package, forming a lip.

11. The package of claim 9, wherein said cap member extends beyond said perimeter wall of said level-two package above said first side of said perimeter wall or beyond said perimeter wall above said second side of said perimeter wall of said level-two package, forming a lip.

12. The package of claim 10, wherein said band, which has a first and a second end, surrounds and contacts said lower surface of said level-two package and said first and second sides of said perimeter wall of said level-two package and said first and second ends of said band are affixed to said bottom surface of said cap member lip.

13. The package of claim 10, wherein said band, which has a first and second end, wherein one of said ends is affixed to said bottom surface of said cap member lip over one of said sides of said perimeter wall of said level-two package and said other of said ends of said band is affixed to a portion of said bottom surface of said level-two package.

14. A modular integrated circuit package comprising:
    a plurality of level-one integrated circuit packages, each comprising:
      an integrated circuit element, said integrated circuit element comprising an integrated circuit formed on a semiconductor substrate and having a plurality of electrical interconnect leads extending therefrom;
      a protective layer surrounding said integrated circuit element, said protective layer having an upper surface, a lower surface and a perimeter wall, and wherein said leads extend from said substrate through said perimeter wall of said protective layer;

said level-one packages being aligned in a stacked configuration to form a level-two package; said level-two package having an upper surface, a lower surface, and a perimeter wall having a front, a back, and a first and second side; wherein said leads from said level-one packages are aligned in a row and column configuration on either or both said front and back side of said level-two package; wherein said upper surface of said level-two package comprises the top surface of a cap member having a top and a bottom surface; and a high temperature flexible band which surrounds and contacts at least a portion of said top or bottom surface of said cap member and said lower surface of said level-two package and either said first or second side of said level-two package.

15. A method of fabricating a modular integrated circuit package containing a plurality of integrated circuit packages, comprising the steps of:
   (a) stacking a plurality of integrated circuit packages;
   (b) aligning said stack of packages so that leads which extend outwardly from said packages are aligned in a row and column configuration;
   (c) attaching said leads from said integrated circuit packages to electrically conductive external rails;
   (d) binding together said stack of packages by use of a thin high temperature flexible material.

16. The method of claim 15, wherein said high temperature flexible material comprises silicon adhesive tape.

17. The method of claim of 15, wherein said high temperature flexible material comprises a conformal coating.

18. The method of claim 17, wherein said step of binding together said stack of packages further comprises the steps of:
   holding said stack of packages securely together; and
   dipping opposite ends of said stack which do not have leads extending therefrom into a conformal coating mixture so that a thin layer is applied to the opposite ends of the stack, whereby each package is secured in proper alignment in a row and column configuration.

19. A method of fabricating a modular integrated circuit package containing a plurality of integrated circuit packages, comprising the steps of:
   (a) stacking a plurality of integrated circuit packages to form a level-two stack; said level-two stack having an upper surface, a lower surface, and a perimeter wall having a front, a back, and a first and second side; wherein leads which extend from said packages and are aligned in a row and column configuration on either or both said front and back side of said level-two stack; and wherein said upper surface of said level-two stack comprises the top surface of a cap member having a top and, a bottom surface; and
   (b) attaching said leads from said integrated circuit packages to electrically conductive external rails;
   (c) affixing an end of a first tape, having a first and a second end, containing an adhesive high temperature flexible material, to a portion of the lower surface of said level-two stack on said first side of said level-two stack; and
   (d) affixing the other end of said tape to a portion of the bottom surface of said cap member on said first side of said level-two stack.

20. The method of claim 19, comprising the additional steps of:
   (e) affixing an end of a second tape having a first and second end to a portion of the lower surface of said level-two stack on said second side of said level-two stack; and
   (f) affixing the other end of said tape to a portion of the bottom surface of said cap member on said second side of said level-two stack.

21. The method of claim 20, wherein said cap member electrically and thermally coupled to one or more of said rails.

22. A method of fabricating a modular integrated circuit package containing a plurality of integrated circuit packages, comprising the steps of:
   (a) stacking a plurality of integrated circuit packages to form a level-two stack; said level-two stack having an upper surface, a lower surface, and a perimeter wall having a front, a back, and a first and second side; wherein leads which extend from said packages and are aligned in a row and column configuration on either or both said front and back side of said level-two stack; and wherein said upper surface of said level-two stack comprises the top surface of a cap member having a top and a bottom surface; and
   (b) attaching said leads from said integrated circuit packages to electrically conductive external rails;
   (c) affixing a first end of a tape, having a first and a second end, containing an adhesive high temperature flexible material, to a portion of the top or bottom surface of said cap member of said level-two stack on said first or second side of said level-two stack;
   (d) applying said tape over said first or second side and wrapping the tape around the lower surface of said level-two stack; and
   (e) affixing said second end of said tape to a portion of the top or bottom surface of said cap member of said level-two stack on said other first or second side, respectively, of said level-two stack so that said tape is in adhesive contact with said upper and lower surface and with at least a portion of an end of each integrated circuit package in said level-two stack.

* * * * *

UNITED STATES PATENT AND TRADEMARK OFFICE
CERTIFICATE OF CORRECTION

PATENT NO. : 5,377,077
DATED : December 27, 1994
INVENTOR(S) : Carmen D. Burns

It is certified that error appears in the above-indentified patent and that said Letters Patent is hereby corrected as shown below:

At col. 10/ln. 30 delete "tops of", and insert therefor --top or--.

At col. 10/ln. 30 after "surface", insert --of--.

At col. 12/ln. 23, before "electrically", insert --is--.

Signed and Sealed this

Fourth Day of April, 1995

Attest:

BRUCE LEHMAN

*Attesting Officer*  *Commissioner of Patents and Trademarks*